United States Patent
Yang et al.

[11] Patent Number: 6,162,583
[45] Date of Patent: Dec. 19, 2000

[54] METHOD FOR MAKING INTERMETAL DIELECTRICS (IMD) ON SEMICONDUCTOR INTEGRATED CIRCUITS USING LOW DIELECTRIC CONSTANT SPIN-ON POLYMERS

[75] Inventors: Tsung-Ju Yang, Chutung Hsinchu; Chien-Mei Wang, Taipei; Tsung-Kuei Kang, Hsin-chu, all of Taiwan

[73] Assignee: Industrial Technology Research Institute, Hsin-Chu, Taiwan

[21] Appl. No.: 09/044,783

[22] Filed: Mar. 20, 1998

[51] Int. Cl.[7] ............................................. G03F 7/26
[52] U.S. Cl. .......................... 430/313; 430/317; 438/622
[58] Field of Search ................................... 430/312, 313, 430/314, 316, 317; 438/622, 624

[56] References Cited

U.S. PATENT DOCUMENTS

| | | | |
|---|---|---|---|
| 5,082,801 | 1/1992 | Nagata | 437/190 |
| 5,468,342 | 11/1995 | Nulty et al. | 156/643.1 |
| 5,472,825 | 12/1995 | Sayka | 430/311 |
| 5,818,111 | 10/1998 | Jeng et al. | 257/776 |
| 5,858,869 | 1/1999 | Chen et al. | 438/597 |
| 5,861,345 | 1/1999 | Chou et al. | 438/763 |
| 5,866,448 | 2/1999 | Pradeep et al. | 438/231 |
| 5,880,018 | 3/1999 | Boeck et al. | 438/619 |
| 5,935,868 | 8/1999 | Fang et al. | 438/692 |

*Primary Examiner*—Kathleen Duda
*Attorney, Agent, or Firm*—George O. Saile; Stephen B. Ackerman

[57] ABSTRACT

The present invention is a method for making intermetal dielectrics (IMD) on integrated circuits using a low dielectric constant (low k) spin-on polymers without via hole poisoning. A patterned conductive layer is used to form metal interconnection for the integrated circuits. A IMD layer is then formed by depositing sequentially three IMD layers, IMD1, IMD2 and IMD3 respectively. The IMD1 is deposited first and is a low k polymer. IMD2 composed of silicon nitride ($Si_3N_4$) and a thick IMD3 composed of silicon oxide ($SiO_2$) is deposited next. The IMD3 is planarized, and a photoresist mask is used to pattern openings in IMD3 to form a hard mask for etching the remaining via holes in IMD2 and IMD3. The IMD2 layer protects the low k polymer (IMD1) from damage while plasma ashing in oxygen is used to removal the photoresist mask. This method circumvents the problems with more conventional processing in which the low k polymer exposed in the via hole during oxygen plasma removal of the photoresist results in a porous and highly hygroscopic polymer leading to via hole poisoning. In a second approach a thick low k polymer layer (IMD1) is planarized and the PECVD silicon oxide (IMD2) a nd a PECVD silicon nitride (IMD3) is deposited and then the via holes are etched as in the first approach using IMD3 as a hard mask.

20 Claims, 5 Drawing Sheets

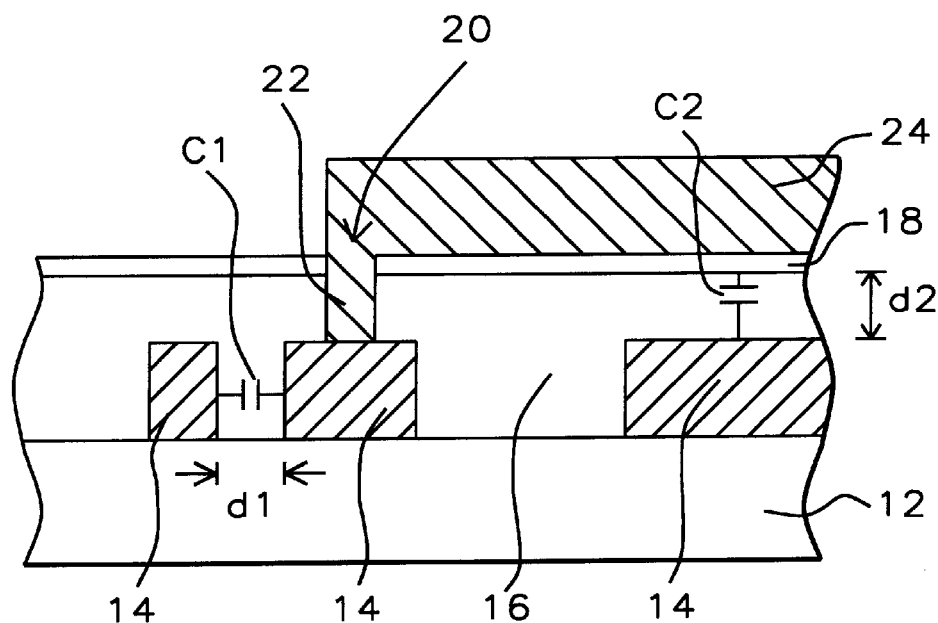
FIG. 1 – Prior Art
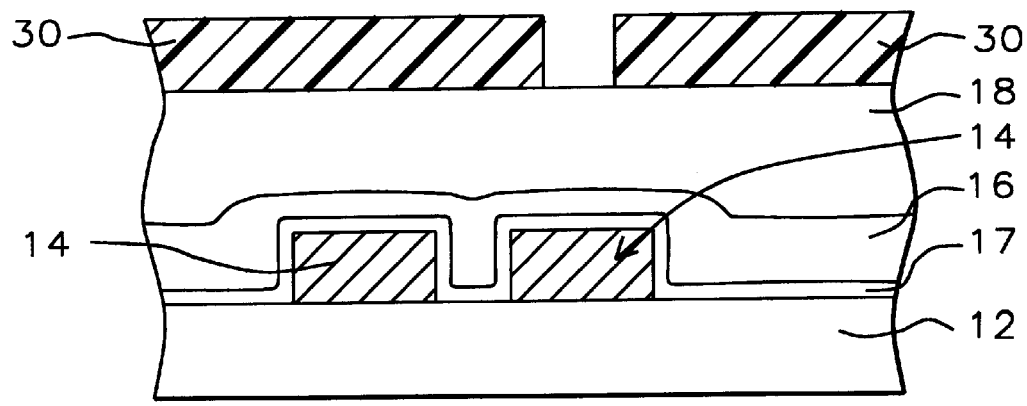
FIG. 2 – Prior Art

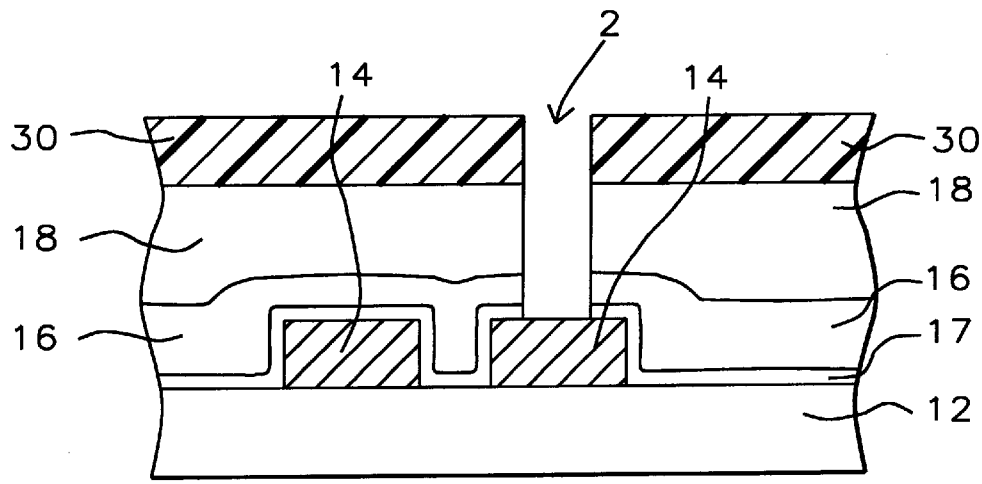
FIG. 3 – Prior Art
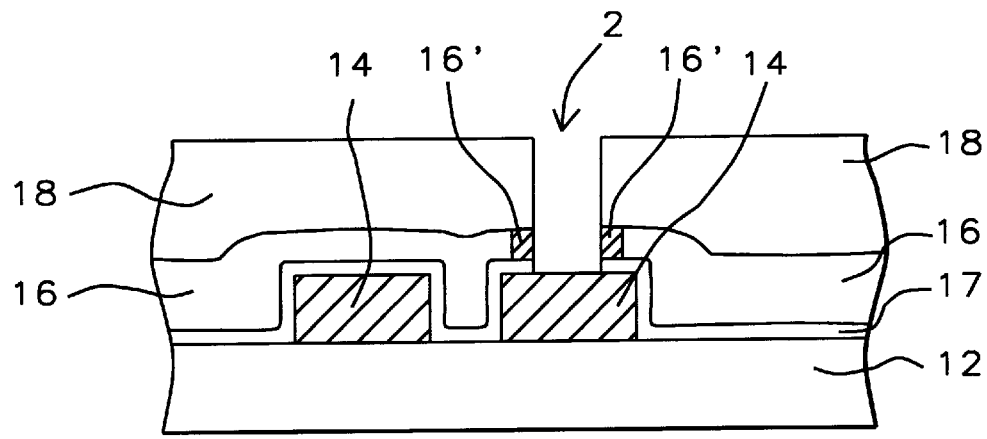
FIG. 4 – Prior Art
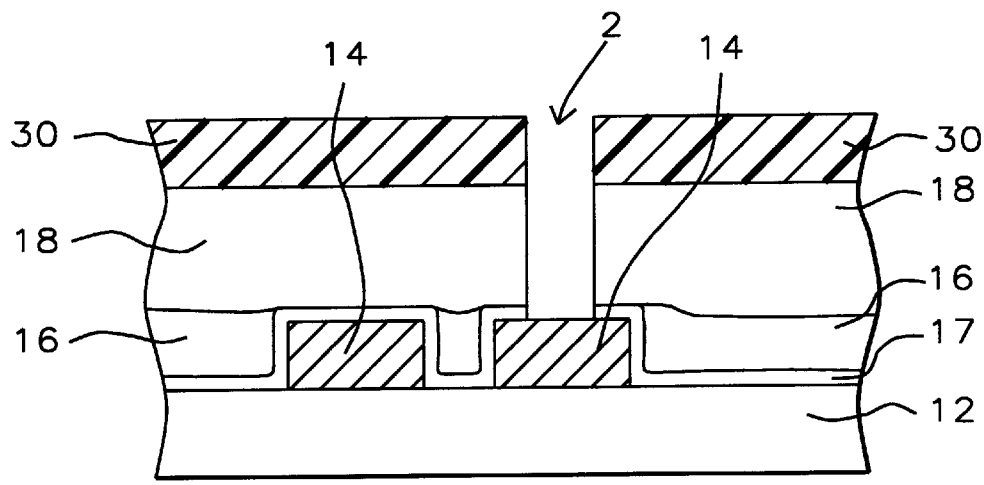
FIG. 5 – Prior Art

METHOD FOR MAKING INTERMETAL DIELECTRICS (IMD) ON SEMICONDUCTOR INTEGRATED CIRCUITS USING LOW DIELECTRIC CONSTANT SPIN-ON POLYMERS

BACKGROUND OF THE INVENTION (1) Field of the Invention

The present invention relates to a method for making integrated circuits on semiconductor substrates, and more particularly to a method for forming intermetal dielectric (IMD) layers with low dielectric constants (k) to reduce the RC time delays of multilevel wiring for semiconductor integrate circuits. The method is particularly useful for interconnections on ULSI circuits with minimum feature sizes less than 0.25 micrometers (um).

(2) Description of the Prior Art

The fabrication of Ultra Large Scale Integrated (ULSI) circuits on semiconductor substrates requires multi-levels of metal interconnections. The metal interconnections are used to wire up the discrete semiconductor devices, such as field effect transistors (FETs) and bipolar transistors, on semiconductor chips. In more conventional methods, plasma-enhanced chemical vapor deposited (PECVD) silicon oxide ($SiO_2$) is used as the insulating layer between adjacent metal lines and between the different levels of metal interconnections to electrically insulate the metal lines. The interposed insulating layers have etched via holes which are used to connect one level of metal to the next.

Typically, the silicon oxide ($SiO_2$) has a relatively high dielectric constant k (relative to vacuum) of about 4.1 to 4.5. However, it is very desirable to reduce the resistance R of the metal lines and the capacitance C between metal lines, since the circuit performance is improved when the RC time constant is reduced. This is particularly important as the device dimensions decrease and the packing density increases, since it is necessary to reduce the spacings between the metal lines in the interconnections to effectively wire up the integrated circuits. Unfortunately, as the spacings between metal lines decrease, the capacitance C increases since the capacitance C is inversely proportional to the spacing d between the lines, where $C=ke_O A/d$, and where k is the relative dielectric constant, $e_O$ is the permittivity of the free space (vacuum), A is the area, and d is the spacing between lines.

The problem is best exemplified with reference to the schematic cross-sectional view in FIG. 1. Shown is a portion of an insulating layer 12 on a substrate containing semiconductor devices. The substrate and devices are not depicted to simplify the drawings and discussion. A first metal (conductive) layer 14 is patterned to form metal lines 14. A low dielectric constant spin-on polymer 16 (hereafter referred to as a low k polymer) is deposited over and between the first metal lines 14, as an InterMetal Dielectric (IMD) layer 16, and is planarized. An inorganic insulating layer 18, such as $SiO_2$, is deposited, and via holes are etched in layer 18 and the IMD layer 16. Metal plugs or second level of metal lines are then formed in the via holes to make electrical contact to the first metal lines 14. One of the many via holes 20 having a metal plug 22 is depicted in FIG. 1. A second metal layer 24 is then deposited and patterned to form the second level of metal interconnecting lines 24. As the device minimum feature sizes decrease and the packing density increases, the corresponding spacings $d_1$ between metal lines 14 used to wire up the devices are also reduced. The capacitance C1 (as depicted in FIG. 1) increases and results in longer RC delay times. Also as the wiring density increases, the capacitance C2 between metal levels (14 and 24) increases because of increased surface area A. Therefore, it is important to use a low k polymer, such as layer 16, to reduce the overall capacitance and to increase circuit speed and to reduce cross talk (coupling) between adjacent metal lines.

Unfortunately, when the via holes are etched in the low k polymer, the exposed polymer is damaged in the via holes during the plasma ashing in oxygen used remove the via hole photoresist etch mask after plasma etching. This damaged portion of the low k polymer (or low k spin-on glass (SOG)) becomes strained resulting in cracking, and becomes much more hygroscopic. Therefore, absorption of moisture of the damaged low k polymer or SOG during exposure to atmosphere later results in unwanted metal corrosion and high contact resistance in the via hole. This problem is best exemplified with reference to the prior art, shown in FIGS. 2 through 4, for forming the conventional low k polymer IMD layer/via hole structure.

As shown in FIG. 2, a first metal layer 14 is deposited and patterned to form metal lines 14 on an insulating layer 12 over the devices formed on a substrate. The substrate having completed semiconductor devices is not depicted to simplify the drawing and discussion. Next, a low k polymer layer 16 is spin-coated, with or without an adhesion/barrier layer 17 (such as a low-temperature PECVD silicon oxide). The low k polymer is cured, and a second IMD layer 18, typically a PECVD $SiO_{21}$ is deposited and planarized by chemical/mechanical polishing (CMP). A via hole photoresist mask 30 is formed by conventional means having openings over the first metal lines 14 where via holes in the IMD layers 18 and 16 are required. Now as shown in FIG. 3, anisotropic plasma etching is used to form the via holes, such as via hole 2. Now as shown in FIG. 4, after the via holes are etched, the photoresist mask 30 is removed by plasma ashing in oxygen. Unfortunately, portions 16' of the low k polymer 16 (or SOG) exposed in the via holes to the oxygen plasma are damaged, resulting in a porous, strained layer that is very hygroscopic, which can absorb moisture ($H_2O$) and degrade (corrode) the metal plugs that are later formed in the via holes for the next level of metal interconnections.

One common method of circumventing this exposure problem with low k polymer (or SOG) is a partial etch back method in which the low k polymer 16 is etched or polished back to the barrier layer 17 on the metal lines 14, and then th e second CVD silicon oxide insulat ing layer 18 is deposited. The via holes are etched in layers 18 and 17, thereby preventing exposure of the low k polymer or SOG, as depicted in FIG. 5. However, the process is more complex and the advantage of using the low k polymer layer between metal levels to lower interlevel capacitance C2 is lost.

Several methods for forming planarized interconnections using SOG as the intermetal dielectric (IMD) have been described. For example, Sayka U.S. Pat. No. 5,472,825, describes a SOG etch back method similar to the prior art shown in FIG. 5, but does not address the damage problem of a low k polymer or SOG in a non-etch back method. Another method for forming multilayer interconnections and insulating layers is described by Nagata, U.S. Pat. No. 5,082,801, in which a barrier/electromigration layer is formed on the patterned first metal layer (Al) and then patterned to reduce stress around the via hole that is later made in the overlying insulating layer, but Nagata does not address nor use a low k polymer or SOG layer for reduced RC delay time or planarization.

Therefore there is still a strong need in the semiconductor industry for providing a simple non-etch back method for forming damage free low k intermetal dielectric (IMD) layers or SOG on multilevel metal interconnections with reduces inter- and intralevel capacitance and improve reliability.

SUMMARY OF THE INVENTION

A principal object of the present invention is to provide an intermetal dielectric (IMD) layer composed, in part, of a low dielectric constant (k) spin-on polymer over closely spaced interconnecting metal lines on integrated circuits, thereby reducing the RC time delays of the circuits.

It is another object of this invention to use a novel via hole etching process that prevents damage (increased porosity) in the low k polymer (or SOG) during photoresist ashing, which causes absorption of moisture, resulting in reduced reliability when moisture outgases during or after the formation of metal plugs in the via holes, commonly referred to as poisoned via holes.

Still another object of this invention is to prevent stress and film cracking that would otherwise occur at the boundary between the damaged (porous) and undamaged spin-on polymer, and further to maintain a low dielectric constant polymer that would otherwise increase due to contamination of the damaged spin-on polymer in the via hole.

In accordance with the objects of this invention, a novel method is provided for forming an IMD layer composed, in part, of a low k spin-on polymer that has damage free via holes between the multilevel interconnections. The improved via holes are provided by protecting the low k polymer from damage when the via hole photoresist mask is removed during plasma ashing in oxygen.

The method for a first embodiment begins by providing a substrate having an insulating layer, such as a semiconductor substrate having field effect transistors (FETs) and/or bipolar transistors device structures, and protected and electrically isolated from the first conductive layer by the insulating layer. A first conductive layer is deposited and patterned to make electrical contact to the semiconductor devices through contact openings in the insulating layer. Typically the first conducting layer is aluminum (Al) or an aluminum-copper (Al—Cu) alloy and includes an underlying barrier layer such as titanium (Ti) or Ti/titanium nitride (TiN) to prevent Al spiking in the shallow junctions of the semiconductor devices on and in the silicon substrate. A first intermetal dielectric (IMD1) layer composed of a low dielectric constant (low k) polymer is spin coated over the patterned first conductive layer, either with or without an adhesion layer (such as a low temperature, plasma enhanced PECVD $SiO_2$). A second intermetal dielectric (IMD2) layer is deposited, preferably composed of a first inorganic insulator, such as a PECVD silicon nitride. A relatively thick third intermetal dielectric (IMD3) layer is deposited, composed of a second inorganic insulator, such as PECVD $SiO_2$. The third intermetal dielectric layer ($SiO_2$) is planarized, for example, by chemical/mechanical polishing (CMP). A photoresist layer is spin coated over the third intermetal dielectric layer. The photoresist is exposed and developed to form openings in the photoresist over the patterned first conductive layer where via holes are required in the multilayer IMD.

Continuing and more specifically by the method of this invention, anisotropic plasma etching is used to etch the exposed third IMD3 layer in the openings to the second IMD2 layer ($Si_3N_4$). The photoresist etch mask is stripped using an oxygen plasma, while the second IMD2 layer protects the low k polymer (IMD1) layer from oxygen damage during the plasma ashing. Now, the second and first intermetal dielectric layers (IMD2 and IMD1) are anisotropically plasma etched using the third IMD layer as an etching mask (hard mask). Preferably the plasma etching is carried out using a high-density plasma etcher and a etchant gas composed of one or more of the following gases: oxygen ($O_2$), trifluoro-methane ($CHF_3$), carbon tetrafluoride ($CF_4$), and carbon dioxide ($CO_2$), and using a carrier gas such as argon (Ar). This completes the formation of the via holes in the intermetal dielectric multilayers (IMD3, IMD2, and IMD1) to the first conductive layer (e.g., Al—Cu), while preventing oxygen plasma damage to the low k polymer (IMD1) in the via hole.

By the method of a second embodiment, a relatively thick first intermetal dielectric (IMD1) layer, composed of a low k polymer, is first planarized, for example using chemical/mechanical polishing (CMP). Then a second intermetal dielectric (IMD2) layer, composed of PECVD silicon oxide, is deposited, followed by the deposition of a third intermetal dielectric (IMD3) layer, composed of $Si_3N_4$. Conventional photolithographic techniques are used to form a photoresist mask having openings over the first conductive layer where contacts are desired. The third IMD layer (IMD3) is then etched to the second IMD layer (IMD2), and the photoresist is stripped by oxygen plasma ashing while the IMD2 layer protects the low k polymer (IMD1) from damage. The third IMD (IMD3) layer is used as a hard mask and via holes are etched in the remaining layers to the first conductive layer using, for example, an etch gas mixture such as $CF_4$ and/or $CHF_3$, and using Ar as the carrier gas.

In both embodiments, since the exposed low k polymer is not exposed to oxygen during the relatively long plasma ashing step the low k polymer is essentially damage free.

BRIEF DESCRIPTION OF THE DRAWINGS

The objectives and other advantages of this invention are best understood with reference to the preferred embodiments and accompanying drawings.

FIG. 1 is a schematic cross-sectional view of a typical first- and second-metal interconnection structure using a low k polymer as the intermetal dielectric (IMD) layer between metal levels. Also depicted is the reduced intra- and inter-level capacitances C1 and C2, respectively.

FIGS. 2 through 4 are schematic cross-sectional views of the prior art showing the sequence of process steps for making an intermetal dielectric structure having via holes showing exposed low k polymer that is damaged during oxygen plasma ashing to remove the photoresist mask.

FIG. 5 is a schematic cross-sectional view of the prior art for making an intermetal dielectric structure using partial etch-back method to avoid oxygen plasma ashing damage to the low k polymer during removal of the photoresist mask.

DESCRIPTION OF THE PREFERRED EMBODIMENTS

The present invention relates to a method for fabricating low k polymer intermetal dielectrics (IMD) in which via holes are etched without damaging the low k polymer exposed in the via holes. The method utilizes a partial etch to form a hard mask in a multilayer IMD after which the via hole photoresist mask is removed by plasma ashing in oxygen. A second IMD (IMD2) layer protects the low k polymer from oxygen plasma damage. Although the method is described for forming a IMD between the first and second patterned conductive layers, such as Al or Al—Cu, it should be well understood by one skilled in the art that the method can also be applied to IMD layers between other metal levels of a multilevel interconnecting structure.

Figure 6:
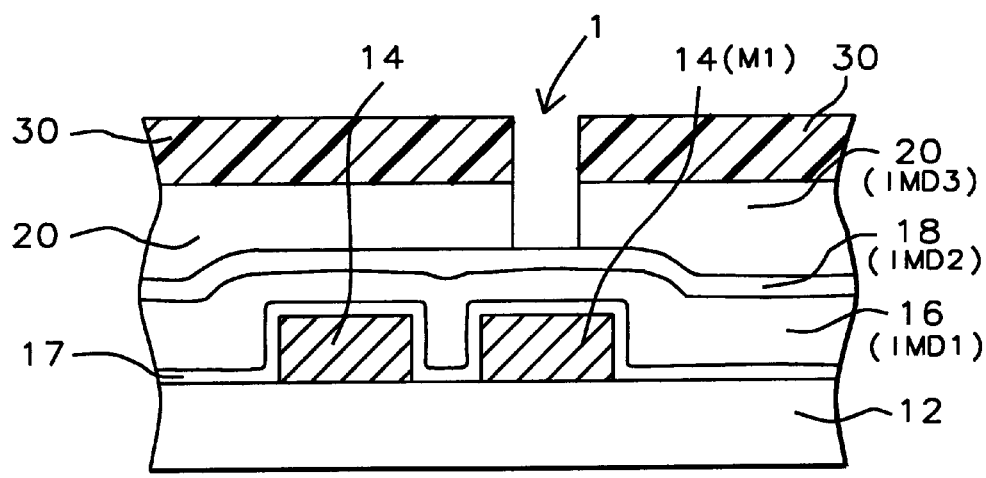
FIGS. 6 through 8 show schematic cross-sectional views for the sequence of process steps for making a damage-free low k polymer IMD by the method of a first embodiment of this invention.

Referring now to FIG. 6, the method of the first embodiment begins by providing a semiconductor substrate having semiconductor devices protected by an insulating layer 12. Only the upper portion of the insulating layer 12 is shown to simplify the drawings and the discussion.

As shown in FIG. 6, a conductive laye r 14 is deposited and patterned. Preferably layer 14 is composed of an aluminum-copper (Al—Cu) alloy and includes an underlying barrier layer such as titanium (Ti) or Ti/titanium nitride (TiN) to prevent Al spiking in the silicon substrate, but is not depicted as a separate layer in the drawings. Layer 14 is deposited, for example, by physical vapor deposition (PVD) to form a first metal (M1) layer to a preferred thickness of between about 4000 and 8000 Angstroms. Layer 14 is then patterned over the insulating layer 12 using conventional photolithographic techniques and anisotropic plasma etching, for example, using a reactive ion etcher (RIE) or a high-density plasma (HDP) etcher, and a reactant gas mixture that contains a chlorine species. The first metal layer 14 is typically used for making electrical contact to semiconductor devices on the substrate (not depicted in the drawings). The electrical insulating layer over the patterned first metal layer 14 is formed by depositing three separate intermetal dielectric layers (IMD1, IMD2, and IMD3). The first intermetal dielectric (IMD1) layer 16 is deposited preferably with an adhesion layer 17, but alternatively can be deposited without adhesion layer 17, as determined by processing requirements. Preferably layer 16 (IMD1) is composed of a low dielectric constant (low k) polymer and is deposited by spin coating. When an adhesion layer 17 is used, it is typically a low temperature $SiO_2$ because of the low melting temperature of the Al. For example, layer 17 can be deposited by plasma-enhanced CVD using silane ($SiH_4$) and oxygen ($O_2$) as the reactant gas mixture in a temperature range of between about 250 and 350° C. Next the low k polymer layer 16 is deposited by spin-coating. For example, the polymer can be composed of organic material, such as a polyimide having a dielectric constant k of between about 3.0 and 3.7, a polysilsequioxane (Si polymer) with a k of about 2.7–3.0, a fluorinated polyimide with a k of about 2.5, and similar silicon or carbon based low k organic polymer films. The low k polymer is coated to a preferred thickness of between about 2000 and 12000 Angstroms.

Still referring to FIG. 6, a second intermetal dielectric (IMD2) layer 18 is deposited, preferably composed of a first inorganic insulator, such as a PECVD silicon nitride ($Si_3N_4$). Preferably the $Si_3N_4$ is deposited by PECVD using $SiH_4$ and ammonia ($NH_3$), or $SiH_4$ and nitrogen ($N_2$) as the reactant gas mixture, and is deposited at a temperature of between 200 and 350° C. Layer 18 is deposited to a preferred thickness of between about 100 and 2000 Angstroms. A relatively thick third intermetal dielectric (IMD3) layer 20 is deposited, composed of a second inorganic insulator, such as PECVD $SiO_2$. Layer 20 is also deposited using PECVD using a gas mixture such as $SiH_4$ and $O_2$ at a temperature between 200 and 350° C. Layer 20 is deposited to a preferred thickness of between about 2000 and 8000 Angstroms. The third intermetal dielectric layer ($SiO_2$) 20 is then planarized by chemical/mechanical polishing (CMP) to provide a planar surface for the next level of metal inter-connections.

Continuing with FIG. 6, a photoresist layer 30 is deposited over the third intermetal dielectric layer 20 by spin coating. Conventional photolithographic techniques are used to expose and developed openings in the photoresist layer 30 over the patterned first conductive layer 14 where via holes are required. One of the many typical openings formed is depicted in FIG. 6 as opening 1.

Now by the method of this invention, the patterned photoresist layer 30 having openings 1 is used as a via hole etch mask to anisotropically plasma etch the exposed third IMD layer 20 in the openings 1 to the surface of the second IMD layer ($Si_3N_4$) 18. This forms a patterned hard mask (layer 20) that is later used to complete the etching of the via holes to the patterned first metal layer 14. The third IMD layer 20 is preferably etched using reactive ion etching or high-density plasma etching and an etchant gas mixture such as $CF_4$ and/or $CHF_3$ and using a carrier gas such as Ar.

Figure 7:
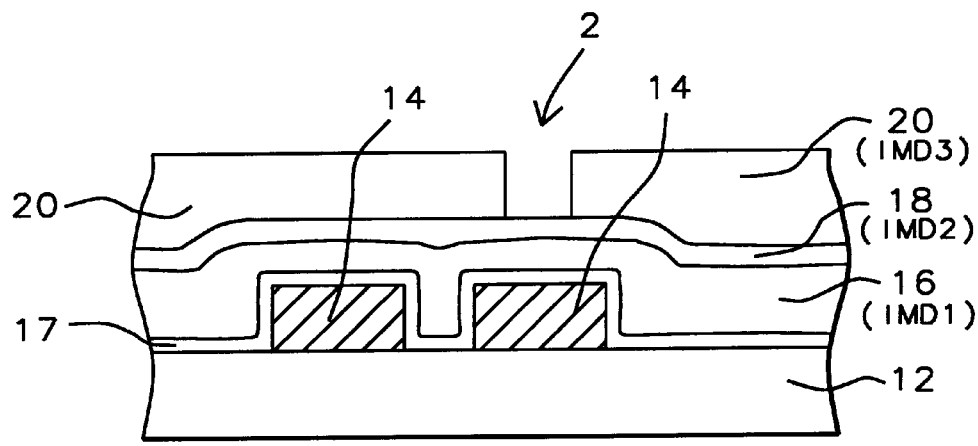

Referring, now to FIG. 7, the photoresist mask 30 is stripped using an oxygen plasma ash. The plasma ashing can be carried out in a separate ashing system, but preferably is done in a cluster tool or in the same etching chamber as the silicon oxide etching to reduce processing time and reduce the manufacturing cost. During the oxygen ashing the second IMD layer 18 protects the low k polymer (IMD1) layer 16 from the oxygen plasma damage that would otherwise occur using the more conventional method.

Figure 8:
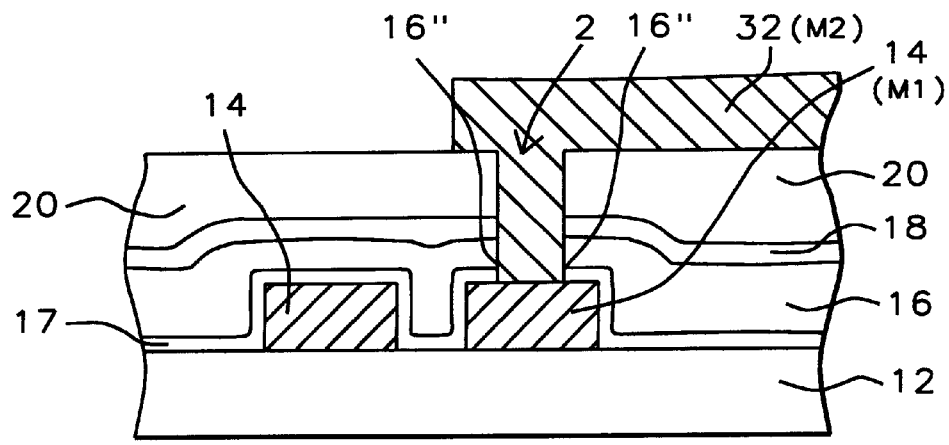

Referring now to FIG. 8, the via holes, such as via hole labeled 2 in the drawing, are completed by using the patterned third IMD layer 20 as a hard mask for etching the remaining portion of the via holes in the $Si_3N_4$ layer 18 (IMD2) and the low k polymer layer 16 (IMD1) to the metal lines 14. Preferably the $Si_3N_4$ layer 18 is anisotropically plasma etched in a RIE or HDP etcher using an etchant gas mixture such as $CHF_3$ and $O_2$, and the low k polymer layer 16 is also anisotropically plasma etched using an etchant gas containing one or more of the following gases: $CF_4$, $CO_2$, and $CHF_3$, with Ar as the carrier gas. Since by the method of this first embodiment, the exposed low k polymer 16, indicated as portions 16" in FIG. 8, in the via hole 2 is protected from excess oxygen plasma during the removal of the photoresist layer 30 (mask) the low k polymer is essentially damage-free. For the sake of completing the multilevel metal structure to the second metal level, a second metal layer 32 is deposited and patterned to form metal lines 32 (M2) making electrical contact to M1 in the via hole 2. For example, the second metal 32 can be Al or Al/Cu alloy deposited by physical vapor deposition (PVD) and also using a underlying barrier layer such as Ti or TiN. Alternatively, a metal plug, such as tungsten can be used in the via hole 2 before forming the M1 metal (Al or Al/Cu).

Figure 9:
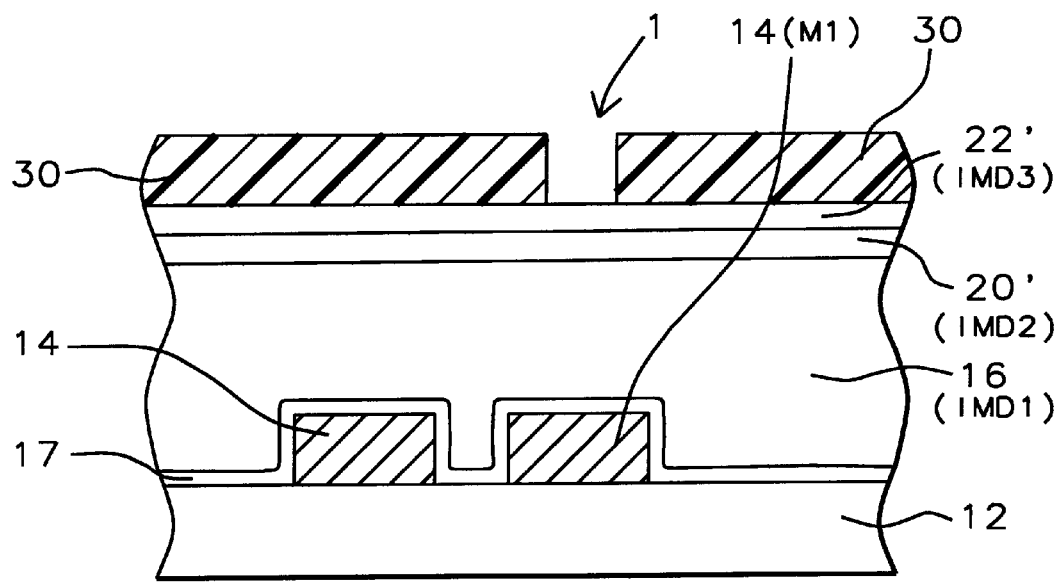
FIGS. 9 through 11 show schematic cross-sectional views for the sequence of process steps for making a damage-free low k polymer IMD by the method of a second embodiment of this invention.
Figure 10:
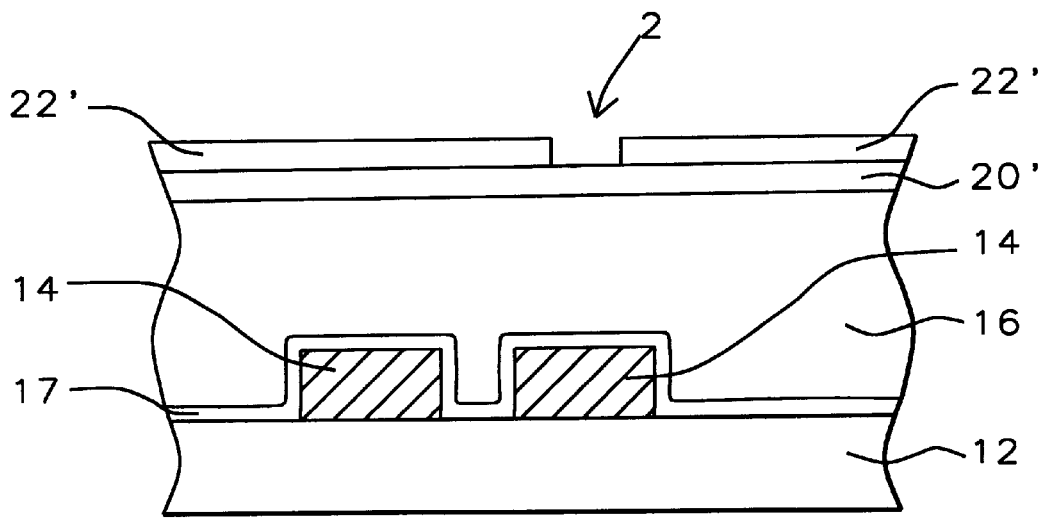
Figure 11:
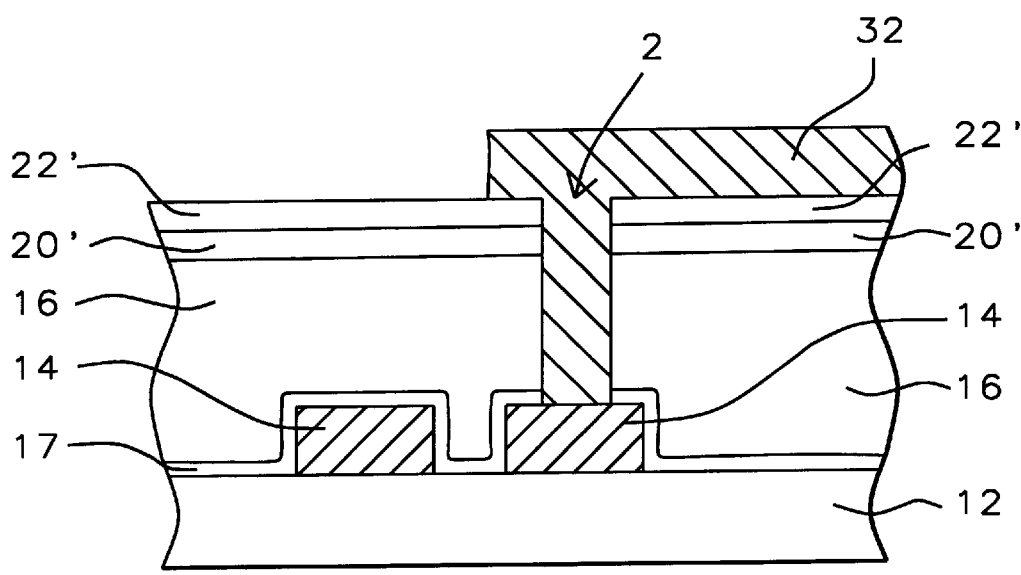

Referring now to FIGS. 9 through 11, a second embodiment of the invention is described for making damage-free via holes in a low k polymer. The method is similar to the first embodiment so all layers are similarly numbered as in the first embodiment.

Referring to FIG. 9, after forming the adhesion layer 17 over the patterned conductive layer 14 formed on the insulating layer 12, as in the first embodiment, a relatively thick low k polymer 16 is deposited by spin-coating to form the first intermetal dielectric (IMD1) layer 16. Layer 16 is deposited to a preferred thickness of between about 2000 and 8000 Angstroms, and is cured and reflowed to form a planar surface. Then a second intermetal dielectric (IMD2) layer 20', composed of PECVD silicon oxide (SiO$_2$), is deposited, followed by the deposition of a third intermetal dielectric (IMD3) layer 22', composed of Si$_3$N$_4$. The thickness of the SiO$_2$ layer 20' is preferably between about 2000 and 4000 Angstroms, and the thickness of Si$_3$N$_4$ layer 22' is between about 100 and 2000 Angstroms. Conventional photo lithographic techniques are used to form a photoresist mask 30 having openings, such as opening 1 in FIG. 9, over the first conductive layer 14 where via holes are required.

Referring to FIG. 10, the third IMD layer 22' is then etched to the second IMD layer 20' in the openings 1 of FIG. 9 to form a hard mask for the via hole etching. Now as in the first embodiment the photoresist is stripped by plasma ashing in oxygen and the hard mask 22' is used to complete the etching of the via holes 2 to the first metal (M1), as shown in FIG. 11. A second metal layer 32 can be deposited and patterned to form the next level of wiring (M2) completing the multilevel metal structure to the second level. However, because the low k polymer layer 16 (IMD1) is thicker and planarized, layer 22' (IMD3) can be made thinner than in the first embodiment resulting a further reduction in capacitance and therefore shorter RC time delays for the same overall IMD (IMD1+IMD2+IMD3) thickness.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an intermetal dielectric layer, having a low dielectric constant, for insulating multilevel metal interconnections comprising the steps of:

providing a semiconductor substrate having semiconductor devices protected by a first insulating layer;

depositing a conductive layer for contacting regions of said devices;

patterning said conductive layer to form a patterned conductive layer for interconnections for said devices;

depositing an adhesion layer on said patterned conductive layer;

depositing a first intermetal dielectric layer composed of a low dielectric constant polymer on said adhesion layer;

depositing a second intermetal dielectric layer composed of a first inorganic insulator;

depositing a third intermetal dielectric layer composed of a second inorganic insulator;

planarizing said third intermetal dielectric layer;

depositing a photoresist layer over said third intermetal dielectric layer;

exposing and developing said photoresist layer to form openings over said patterned conductive layer where via holes are required;

anisotropic plasma etching said third intermetal dielectric layer in said openings in said photoresist to said second intermetal dielectric layer;

stripping said photoresist layer using an oxygen plasma while said second intermetal dielectric layer protects said first intermetal dielectric layer from oxygen damage;

anisotropically plasma etching said second and first intermetal dielectric layers to said conductive layer using said third intermetal dielectric layer as an etching mask, thereby completing via holes to said conductive layer with said first intermetal dielectric layer damage-free in said via holes.

2. The method of claim 1, wherein said conductive layer is composed of aluminum/copper alloy having a barrier layer thereunder composed of titanium/titanium nitride, said conductive layer having a thickness of between 1000 and 8000 Angstroms.

3. The method of claim 1, wherein said adhesion layer is composed of a plasma-enhanced chemical vapor deposited silicon oxide having a thickness of between 500 and 2000 Angstroms.

4. The method of claim 1, wherein said low dielectric constant polymer is deposited by spin coating to a thickness of between 1000 and 12000 Angstroms.

5. The method of claim 1, wherein said low dielectric constant polymer has a relative dielectric constant of between 1.8 and 3.5.

6. The method of claim 1, wherein said second intermetal dielectric layer composed of said first inorganic insulator is silicon nitride deposited to a thickness of between 100 and 2000 Angstroms.

7. The method of claim 1, wherein said third intermetal dielectric layer composed of said second inorganic insulator is a silicon oxide deposited to a thickness of between 500 and 4000 Angstroms.

8. The method of claim 1, wherein said planarizing of said third intermetal dielectric layer is by chemical/mechanical polishing.

9. The method of claim 1, wherein said third intermetal dielectric layer exposed in said openings is anisotropically plasma etched to said second intermetal dielectric layer using an etchant gas mixture of carbon tetrafluoride (CF$_4$), trifluoromethane (CHF$_3$), and argon (Ar).

10. The method of claim 1, wherein said second and first intermetal dielectric layers are anisotropically plasma etched in an etchant gas mixture containing one or more of the gases trifluoromethane (CHF$_3$), carbon tetrafluoride (CF$_4$), and carbon dioxide (CO$_2$) with a carrier gas of argon (Ar).

11. A method for fabricating an intermetal dielectric layer, having a low dielectric constant, for insulating multilevel metal interconnections comprising the steps of:

providing a semiconductor substrate having semiconductor devices protected by a first insulating layer;

depositing a conductive layer for contacting regions of said devices;

patterning said conductive layer to form a patterned conductive layer for interconnections for said devices;

depositing a first intermetal dielectric layer composed of a low dielectric constant polymer on said patterned conductive layer;

planarizing said first intermetal dielectric layer;

depositing a second intermetal dielectric layer composed of a first inorganic insulator;

depositing a third intermetal dielectric layer composed of a second inorganic insulator;

depositing a photoresist layer over said third intermetal dielectric layer;

exposing and developing said photoresist layer to form openings over said patterned conductive layer where via holes are required;

anisotropic plasma etching said third intermetal dielectric layer in said openings in said photoresist to said second intermetal dielectric layer;

stripping said photoresist layer using an oxygen plasma while said second intermetal dielectric layer protects said first intermetal dielectric layer from oxygen damage;

etching said second and first intermetal dielectric layers to said conductive layer using said third intermetal dielectric layer as an etching mask, thereby completing via holes to said patterned conductive layer, with said first intermetal dielectric layer damage-free in said via holes.

12. The method of claim 11, wherein said conductive layer is composed of aluminum/copper alloy having a barrier layer thereunder composed of titanium/titanium nitride, said conductive layer having a thickness of between 1000 and 8000 Angstroms.

13. The method of claim 11, wherein said low dielectric constant polymer is deposited by spin coating to a thickness of between 1000 and 12000 Angstroms.

14. The method of claim 11, wherein said low dielectric constant polymer has a relative dielectric constant of between 1.8 and 3.5.

15. The method of claim 11, wherein a silicon oxide layer is deposited by plasma-enhanced chemical vapor deposition over said patterned conductive laeyr as an adhesive layer for said low dielectric constant polymer, and said silicon oxide layerhas a thickness of between 2000 and 4000 Angstroms.

16. The method of claim 11, wherein said second intermetal dielectric layer composed of said first inorganic insulator is silicon oxide deposited to a thickness of between 2000 and 4000 Angstroms.

17. The method of claim 11, wherein said third intermetal dielectric layer composed of said second inorganic insulator is a silicon nitride deposited to a thickness of between 100 and 2000 Angstroms.

18. The method of claim 11, wherein said planarizing of said first intermetal dielectric layer is achieved after curing by reflowing.

19. The method of claim 11, wherein said third intermetal dielectric layer exposed in said openings in said photoresist is anisotropically plasma etched to said second intermetal dielectric layer using an etchant gas mixture of $CF_4$, $CHF_3$, and Ar.

20. The method of claim 11, wherein said second and first intermetal dielectric layers are anisotropically plasma etched in an etchant gas mixture containing one or more of the gases trifluoromethane ($CHF_3$), carbon tetrafluoride ($CF_4$), and carbon dioxide ($CO_2$) with a carrier gas of argon (Ar).

* * * * *